US008947630B2

(12) United States Patent
Padiy et al.

(10) Patent No.: US 8,947,630 B2
(45) Date of Patent: Feb. 3, 2015

(54) LITHOGRAPHIC APPARATUS AND DEVICE MANUFACTURING METHOD

(75) Inventors: Alexander Viktorovych Padiy, Geldrop (NL); Boris Menchtchikov, Eindhoven (NL); Scott Anderson Middlebrooks, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 1046 days.

(21) Appl. No.: 13/013,333

(22) Filed: Jan. 25, 2011

(65) Prior Publication Data

US 2011/0205511 A1  Aug. 25, 2011

Related U.S. Application Data

(60) Provisional application No. 61/306,020, filed on Feb. 19, 2010.

(51) Int. Cl.
*G03B 27/42* (2006.01)
*G03B 27/68* (2006.01)
*G03F 7/20* (2006.01)

(52) U.S. Cl.
CPC ........ *G03F 7/70633* (2013.01); *G03F 7/70525* (2013.01); *G03F 7/70625* (2013.01); *G03F 7/70641* (2013.01)
USPC ............................................. 355/53; 355/52

(58) Field of Classification Search
CPC ............ G03F 7/70525; G03F 7/70625; G03F 7/70508; G03F 7/70516
USPC ................................. 355/53, 77, 52
See application file for complete search history.

(56) References Cited

U.S. PATENT DOCUMENTS

| 5,243,377 | A  | * | 9/1993  | Umatate et al. | 355/53  |
|-----------|----|---|---------|----------------|---------|
| 6,785,638 | B2 | * | 8/2004  | Niu et al.     | 702/189 |
| 6,842,230 | B2 | * | 1/2005  | Takakuwa et al.| 355/77  |
| 7,075,618 | B2 | * | 7/2006  | Ina et al.     | 355/53  |
| 7,312,873 | B2 | * | 12/2007 | Haginiwa       | 356/401 |
| 7,373,213 | B2 | * | 5/2008  | Oishi et al.   | 700/108 |

(Continued)

FOREIGN PATENT DOCUMENTS

EP    1 628 164 A2    2/2006
JP    2002-353121 A   12/2002

(Continued)

OTHER PUBLICATIONS

English-Language Abstract for Japanese Patent Publication No. 2005-166951 A, published Jun. 23, 2005; 1 page.

(Continued)

*Primary Examiner* — Peter B Kim
*Assistant Examiner* — Deoram Persaud
(74) *Attorney, Agent, or Firm* — Sterne, Kessler, Goldstein & Fox P.L.L.C

(57) ABSTRACT

A method controls scanning function of a lithographic apparatus. A monitor wafer is exposed to determine baseline control parameters pertaining to the scanning function. The baseline control parameters are retrieved from the monitor wafer. Parameter drift is determined from the baseline control parameters. Compensation is performed based on the determination. A different parameterization is used for control of the scanning control module than for communication between the scanning control module and the lithographic apparatus.

27 Claims, 6 Drawing Sheets

(56) References Cited

U.S. PATENT DOCUMENTS

| | | | |
|---|---|---|---|
| 7,381,503 | B2 | 6/2008 | Smith et al. |
| 7,385,700 | B2* | 6/2008 | Matsumoto et al. .......... 356/401 |
| 7,718,327 | B2* | 5/2010 | Okita ............................. 430/22 |
| 8,687,167 | B2* | 4/2014 | Padiy et al. ..................... 355/52 |
| 8,711,329 | B2* | 4/2014 | Van Kemenade ............... 355/53 |
| 2002/0042664 | A1 | 4/2002 | Kikuchi |
| 2003/0022396 | A1* | 1/2003 | Ogawa ............................. 438/7 |
| 2003/0071980 | A1* | 4/2003 | Ina et al. ......................... 355/53 |
| 2003/0204348 | A1* | 10/2003 | Suzuki et al. .................. 702/83 |
| 2003/0204488 | A1* | 10/2003 | Sentoku et al. .................. 707/1 |
| 2004/0063009 | A1* | 4/2004 | Phan et al. ...................... 430/30 |
| 2007/0021860 | A1* | 1/2007 | Gertrudus Simons et al. ............................ 700/121 |
| 2007/0052940 | A1* | 3/2007 | Zaal et al. ....................... 355/53 |
| 2007/0182944 | A1* | 8/2007 | Van De Biggelaar ........... 355/53 |
| 2008/0073589 | A1* | 3/2008 | Adel et al. ................ 250/492.22 |
| 2008/0252870 | A1* | 10/2008 | Jeunink et al. .................. 355/53 |
| 2011/0205510 | A1 | 8/2011 | Menchtchikov et al. |
| 2012/0229786 | A1* | 9/2012 | Engelen et al. ................. 355/67 |

FOREIGN PATENT DOCUMENTS

| | | |
|---|---|---|
| JP | 2005-166951 A | 6/2005 |
| JP | 2009-231564 A | 10/2009 |

OTHER PUBLICATIONS

English-Language Abstract for Japanese Patent Publication No. 2009-231564 A, published Oct. 8, 2009; 1 page.

\* cited by examiner

LITHOGRAPHIC APPARATUS AND DEVICE MANUFACTURING METHOD

CROSS REFERENCE TO RELATED APPLICATION

This application claims benefit under 35 U.S.C. 119(e) to U.S. Provisional Application No. 61/306,020, filed Feb. 19, 2010, which is incorporated by reference herein in its entirety.

BACKGROUND

1. Field of the Present Invention

The present invention relates to methods and apparatus usable, for example, in the manufacture of devices by lithographic techniques.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In order to better control scanner functionality, a module has been recently devised which automatically drives the system towards a pre-defined baseline each day (or so). This scanner stability module retrieves standard measurements taken from a monitor wafer using a metrology tool. The monitor wafer had been previously exposed using a special reticle containing special scatterometry marks. Using the monitor wafer and that day's measurements (and possibly historical measurement data from previous days), the scanner stability module determines how far the system has drifted from its baseline, and then calculates wafer-level overlay and focus correction sets. The baseline can be defined either directly by the reference layer on the monitor wafers (in this case scanner stability module will drive the system towards minimal overlay on the baseliner monitor wafers) or indirectly by a combination of the reference layer on the wafers and a target overlay fingerprint (in this case scanner stability module will drive the system towards the defined target overlay fingerprint on the monitor wafers). The lithography system then converts these correction sets into specific corrections for each exposure on subsequent production wafers.

The current interface between the baseliner controller and the scanner is derived from the known GridMapper™ interface (in which two 2-dimensional polynomials are used: one for the up-scanning fields, and another for the down-scanning fields). One result of this is that the scanner stability module parameterization is unable to cover in detail the scanner intra-field effects. Conversely, too many parameters are used for describing the scanner effects that it can cover.

SUMMARY

It is desirable to provide a system whereby the at least some of the above issues are alleviated.

According to an aspect of the present invention, there is provided a lithographic apparatus comprising a support configured to support a patterning device, a substrate table configured to hold a substrate, a patterning system configured to transfer a pattern from the patterning device onto a target portion of the substrate, a control module operable to aid control of at least one of the support, substrate table or patterning system by periodically retrieving measurements defining baseline control parameters from one or more reference substrates so as to determine parameter drift from the baseline control parameters thereby enabling allowance and/or correction to be made for the drift, the reference substrate(s) having initially undergone patterning so as to determine the baseline control parameters, an interface between the control module and the other lithographic apparatus. The parameterization of the interface is different from the control parameterization of the control module.

According to a second aspect of the present invention there is provided a method of using a control module to control scanning/stepping function of a lithographic apparatus comprising exposing a reference substrate to determine baseline control parameters pertaining to the scanning/stepping function, periodically retrieving the baseline control parameters from the reference substrate, determining parameter drift from the baseline control parameters, and taking corrective action based on the determination. The method is performed using a different parameterization for control of the control module than for communication between the control module and the lithographic apparatus.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
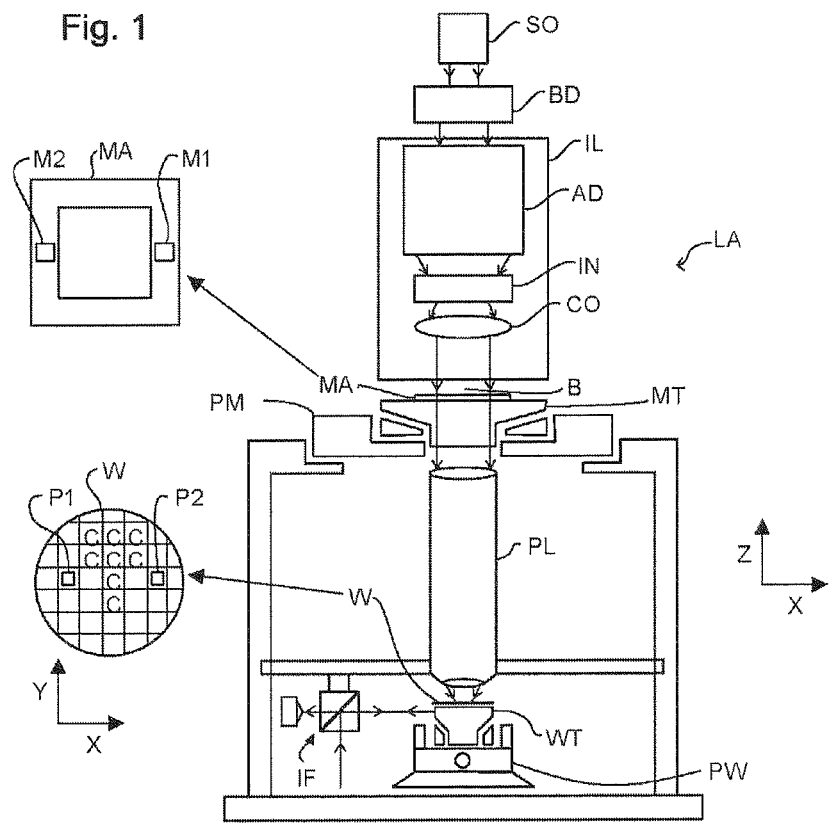
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT configured to support a patterning device (e.g., a mask) MA and connected to a first positioner PM configured to accurately position the patterning device in accordance with certain parameters, a substrate table (e.g., a wafer table) WT configured to hold a substrate (e.g., a resist-coated wafer) W and connected to a second positioner PW configured to accurately position the substrate in accordance with certain parameters and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
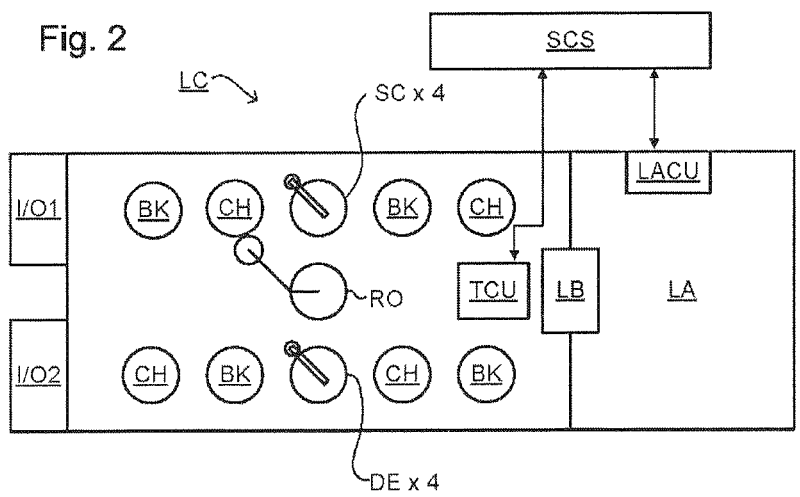
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
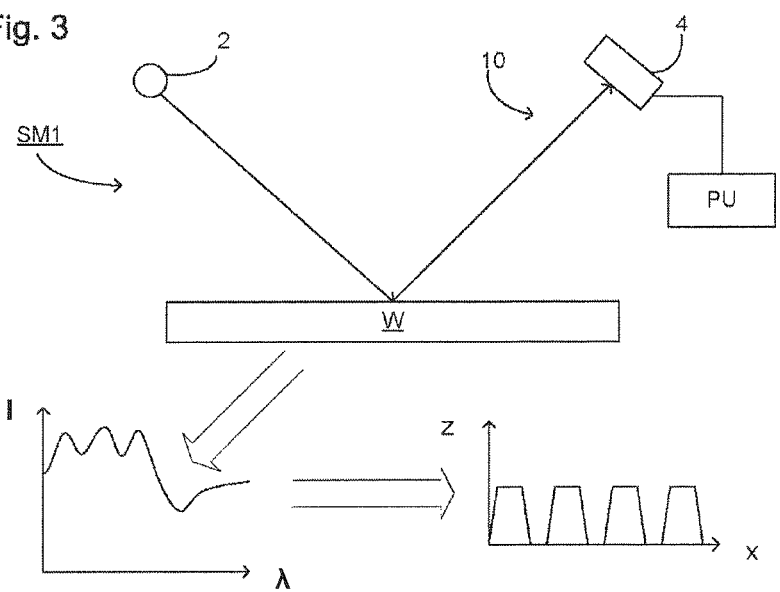
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconfigured by processing unit PU, e.g., by Rigorous Coupled Wave. Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
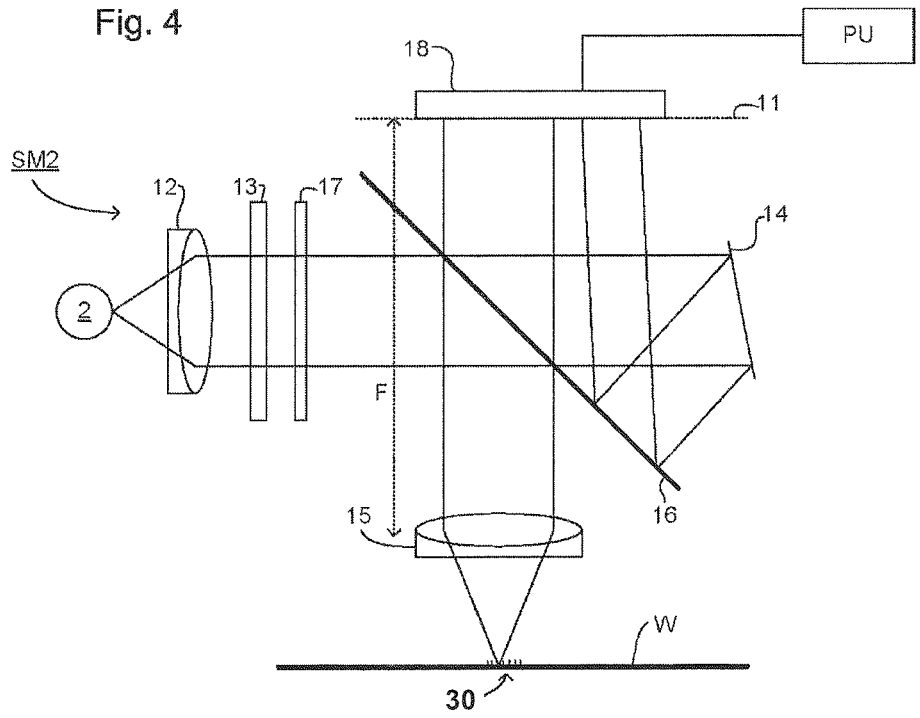
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference minor 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

A key component of accurate lithography is an increased ability to control lithography scanners and scanning functionality (When referring to "scanners" it should be appreciated that this encompasses all the scan modes and functionality described herein, and other scanning functionalities). Improvements to the scanner's focus and overlay (layer-to-layer alignment) uniformity have recently been achieved by the applicant's Baseliner™ scanner stability module, leading to an optimized process window for a given feature size and chip application, enabling the continuation the creation of smaller, more advanced chips.

When a lithography system is first installed, it must be calibrated to ensure optimal operation. However, over time, system performance parameters will drift. A small amount of drift can be tolerated, but too much drift and the system will go out of specification. Consequently manufacturers are required to stop production periodically for re-calibration. Calibrating the system more frequently gives a bigger process window, but at the cost of more scheduled downtime.

The scanner stability module greatly reduces these production stoppages. Instead, it automatically drives the system towards a pre-defined baseline on a regular basis (typically every few days). To do this, it retrieves standard measurements taken from one or more monitor wafers using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

For volume production, it is desirable to have full flexibility when assigning layers for exposure to a scanner. The alternative, layer-scanner dedication, would put monthly output capacity at risk, since any small disturbance of the lithocluster would directly show up in the output of that month. One known approach to overcome this risk is by so called (overlay) grid matching. All scanner grids are intentionally offset a little, such that all scanners more or less have the same (average) grid for overlay. This grid is often referred to as 'holy' or 'golden' grid. Each product layer can now be exposed on each scanner of the same type. This 'golden' grid is exposed and etched onto so called 'reference wafers'. If these 'golden' matching wafers are used as the baseline for overlay stability control instead of random monitoring wafers, overlay grid matching and long-term stability can be achieved in a single automated step.

Figure 5:
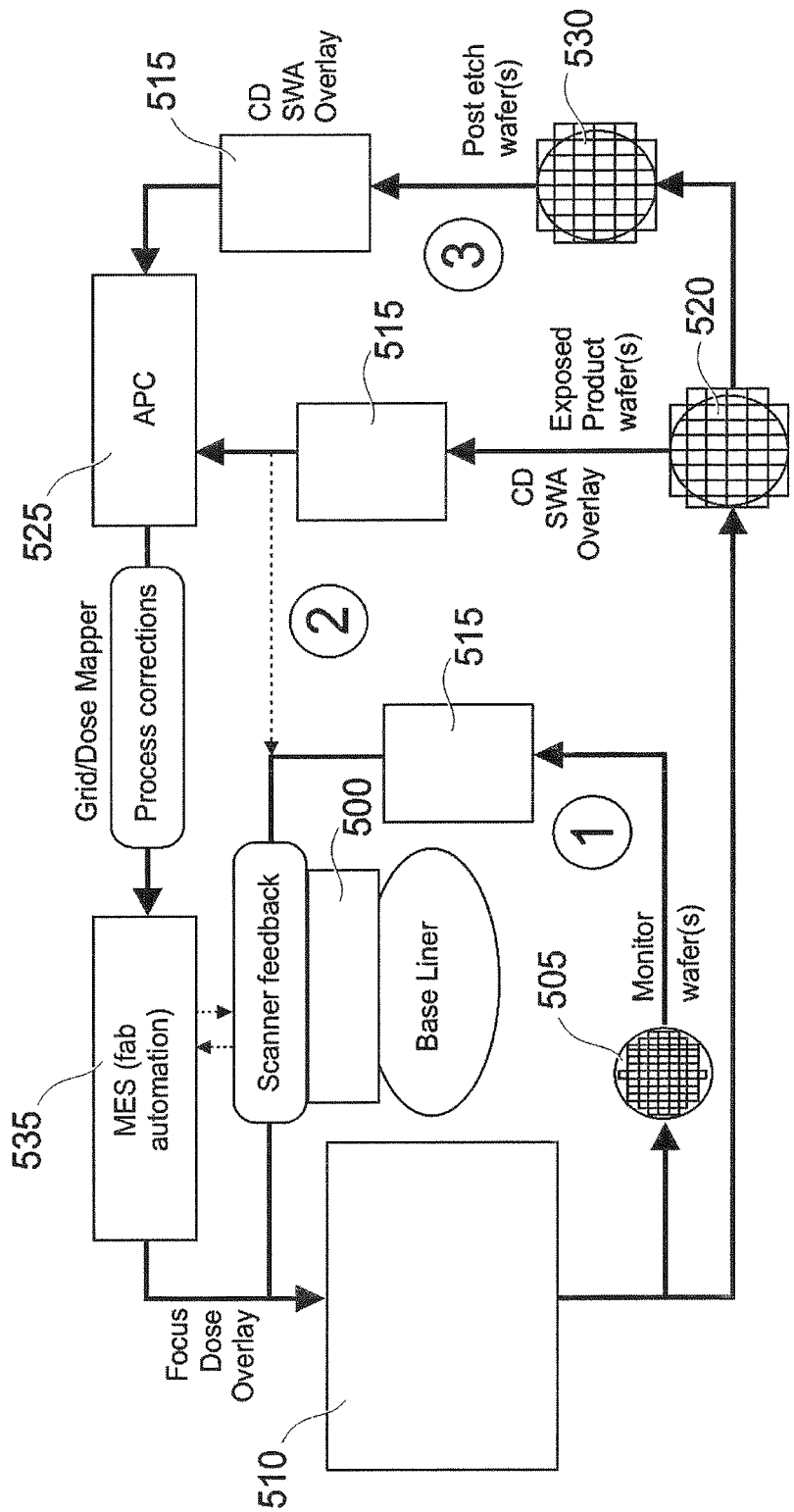
FIG. 5 illustrates the control loops in a lithographic process utilising a scanner stability module.

FIG. 5 depicts the overall lithography and metrology method incorporating the scanner stability module 500 (essentially an application running on a server, in this example). Shown are three main process control loops. The first loop provides the local scanner control using the scanner stability module 500 and monitor wafers. The monitor wafer 505 is shown being passed from the main lithography unit 510, having been exposed to set the baseline parameters for focus and overlay. At a later time, metrology unit 515 reads these baseline parameters, which are then interpreted by the scanner stability module 500 so as to calculate correction routines so as to provide scanner feedback 550, which is passed to the main lithography unit 510, and used when performing further exposures.

The second (APC) loop is for local scanner control on-product (determining focus, dose, and overlay). The exposed product wafer 520 is passed to metrology unit 515 where information relating to the critical dimensions, sidewall angles and overlay is determined and passed onto the Advanced Process Control (APC) module 525. This data is also passed to the scanner stability module 500. Process corrections 540 are made before the Manufacturing Execution System (MES) 535 takes over, providing scanner control to the main lithography unit 510, in communication with the scanner stability module 500.

The third loop is to allow metrology integration into the second APC loop (e.g., for double patterning). The post etched wafer 530 is passed to metrology unit 515 which again passes information relating to the critical dimensions, sidewall angles and overlay, read from the wafer, to the Advanced Process Control (APC) module. The loop continues the same as with the second loop.

Figure 6:
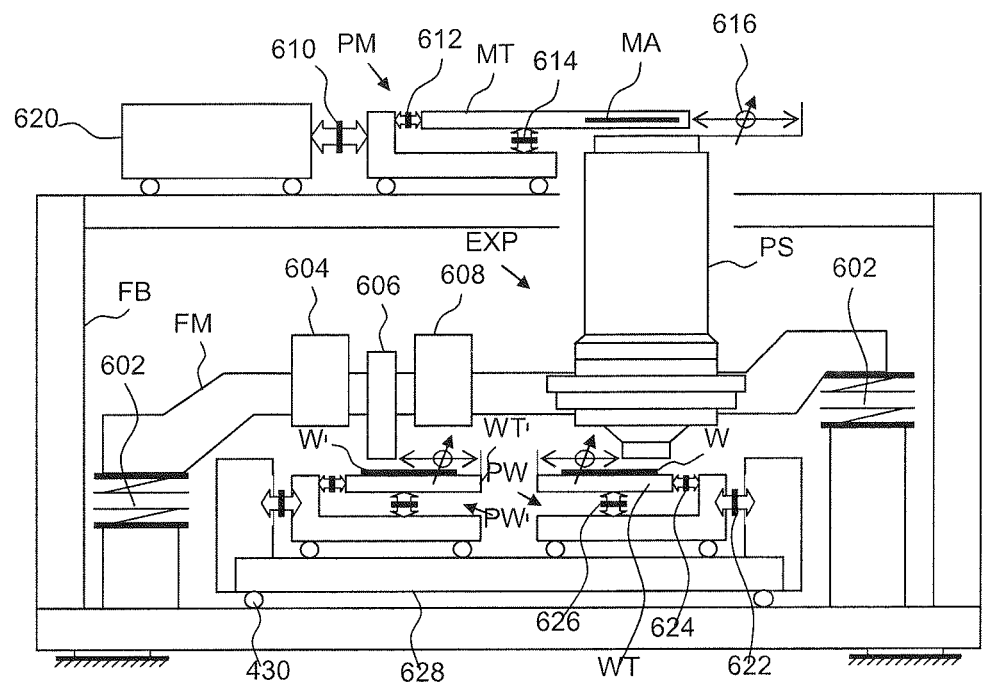
FIG. 6 is a schematic diagram showing components of a lithographic apparatus having separate measurement and exposure stages, usable in an embodiment of the present invention.

FIG. 6 shows schematically the arrangement of one embodiment of the apparatus of FIG. 1, in which the apparatus is of the type having dual substrate supports and separate metrology and exposure stations.

A base frame FB supports and surrounds the apparatus on the ground. Within the apparatus, and serving as an accurate positional reference, a metrology frame FM is supported on air bearings 602, which isolate it from vibrations in the environment. Mounted on this frame are the projection system PS, which naturally forms the core of the exposure station EXP, and also instruments 604, 606, 608, which are the functional elements of the metrology station MET. Above these stations, the mask table MT and mask MA are mounted above the projection system PS. The first positioner PM comprises long-throw (coarse) actuators 610 and short-throw (fine) actuators 612, 614, as described above. These operate by active feedback control to obtain the desired position of mask MA with respect to the projection system PS, and hence with respect to metrology frame FM. This measurement is indicated schematically at 616. The whole positioning mechanism for the mask MA is supported on the base frame at B via active air bearings 618 etc. A balance mass 620 is provided to mimic at least coarse movements of the mask table MT and positioning, to reduce vibrations being transmitted into the frame and other components. A low frequency servo control keeps balance mass 620 in a desired average position. Wafer table WT shown beneath the projection system similarly has coarse actuators 622 and fine actuators 624, 626 for positioning substrate W accurately with respect to the exit lens of the projection system PS. Additionally, according to the dual-stage arrangement of this example, a duplicate wafer table WT' and positioning mechanism PW' are provided. As illustrated, these duplicate elements are supporting a second substrate W' at the metrology station MET. Wafer tables WT, WT' and their respective positioners PW and PW' are carried on and connected to a shared balance mass 628. Again, air bearings, or other suitable bearings such as magnetic, electrostatic and so forth, are shown schematically, for example at 630. Measurements of wafer table position used for the coarse and fine control of the positions of the wafers W and W' are made relative to elements 606 at the metrology station and PS at the exposure station, both of these ultimately referring back to metrology frame FM.

Figure 7:
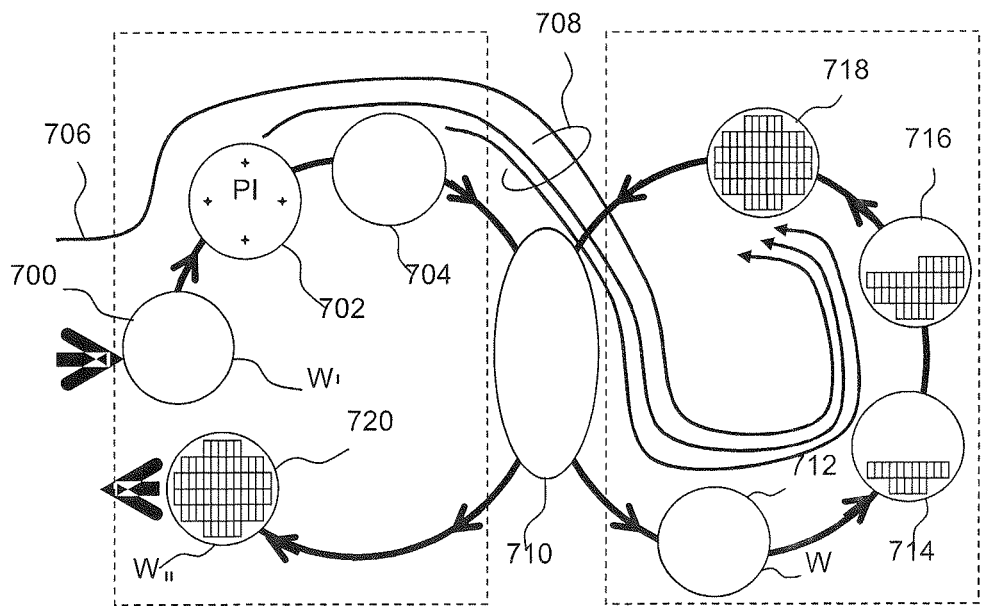
FIG. 7 illustrates schematically the stages in the measurement and exposure processes in the apparatus of FIG. 6, according to known practice.

FIG. 7 illustrates the steps in this twin-stage apparatus of FIG. 6 to expose dies on a substrate W. On the left hand side within a dotted box are steps performed at metrology station MET (measurement side), while the right hand side shows steps performed at the exposure station EXP (exposure side). A substrate W has already been loaded into the exposure station. A new substrate W' is loaded to the apparatus by a mechanism not shown at step 700. These two substrates are processed in parallel in order to increase the throughput of the metrology process as a whole. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography, several times already, and may have subsequent processes to undergo as well. At 702, alignment measurements using the substrate marks P1 etc. and image sensors IAS1 etc. are used to measure and record alignment of the substrate relative to substrate table WT. In practice, several marks across the substrate W' will be measured, to establish the "wafer grid", which maps very accurately the distribution of marks across the substrate, including any distortion relative to a nominal regular grid. At step 704, a map of wafer height against X-Y position is measured also, for use in accurate focusing of the exposed pattern.

When substrate W' was loaded, recipe data 706 are received, defining the exposures to be performed, and also properties of the wafer and the patterns previously made and to be made upon it. To these recipe data are added the measurements made at 702, 704, so that a complete set of recipe and metrology data 708 can be passed to the exposure stage. At 710, wafers W' and W are swapped, so that the measured substrate W' becomes the substrate W entering the exposure apparatus. This swapping is performed by exchanging the supports WT and WT' within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WT (formerly WT') is all that is necessary to make use of the measurement information 702, 704 for the substrate W (formerly W') in control of the exposure steps. At step 712, reticle alignment is performed using the mask alignment marks M1, M2 (FIG. 3C). In steps 714, 716, 718, scanning motions and radiation pulses are applied at successive die locations across substrate W, in order to complete the exposure of a number of patterns. Thanks to the alignment and level map data, these patterns are accurately aligned with respect to desired locations, and, in particular, with respect to features previously laid down on the same substrate. The exposed substrate, now labeled W" is unloaded from the apparatus at step 720, to undergo etching or other processes, in accordance with the exposed pattern.

By employing the separate substrate tables, the performance of the apparatus in terms of substrate throughput through the exposure stages is maintained, while permitting a relatively time-consuming set of measurements to be performed to characterize the wafer and patterns previously deposited upon it. On the other hand, the provision of dual stages, each with its respective positioner PW, PW' sensors etc. adds significantly to the cost of the apparatus. Moreover, since there is a definite time interval (for example 30-60 seconds) between performance of the measurements in steps 702, 704 and the ultimate exposure, using those measurements in steps 714, 716, 718, a risk arises that the dimensions of the substrate and its position, both globally and locally, would change prior to exposure (grid drift), leading to a loss of accuracy in alignment (overlay error). In particular, although the temperature of the environment both within and outside the apparatus is very carefully controlled, even slight temperature variations arising over a time interval of 30 seconds or so can be enough to cause distortion of the pattern as laid on the wafer.

Figure 8:
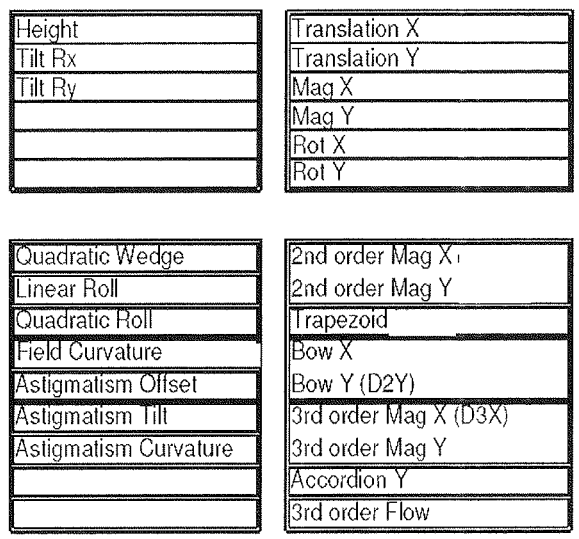
FIG. 8 is a table of the parameters which make up the scanner stability module correction model in a particular embodiment.

FIG. 8 is a table of the parameters which make up the scanner stability module correction model in a particular embodiment. The parameters have been grouped vertically based on whether they are Interfield (two top groups) or Intrafield (two bottom groups). They have also been grouped horizontally according to whether they relate to Focus two (left groups) or Overlay (two right groups).

Currently the interface between the scanner stability module (running on an Off-Tool Application Server, or OTAS) and the scanner is specific to each scanner, with its parameterization predetermined to be the same as that of the scanner. This has the major drawback that it is not possible to communicate new correction parameters that the scanner may be configured to use, as the interface has no mechanism for performing the communication. As new machines capable of using new correction parameters are developed, this becomes an increasing problem.

Figure 9:
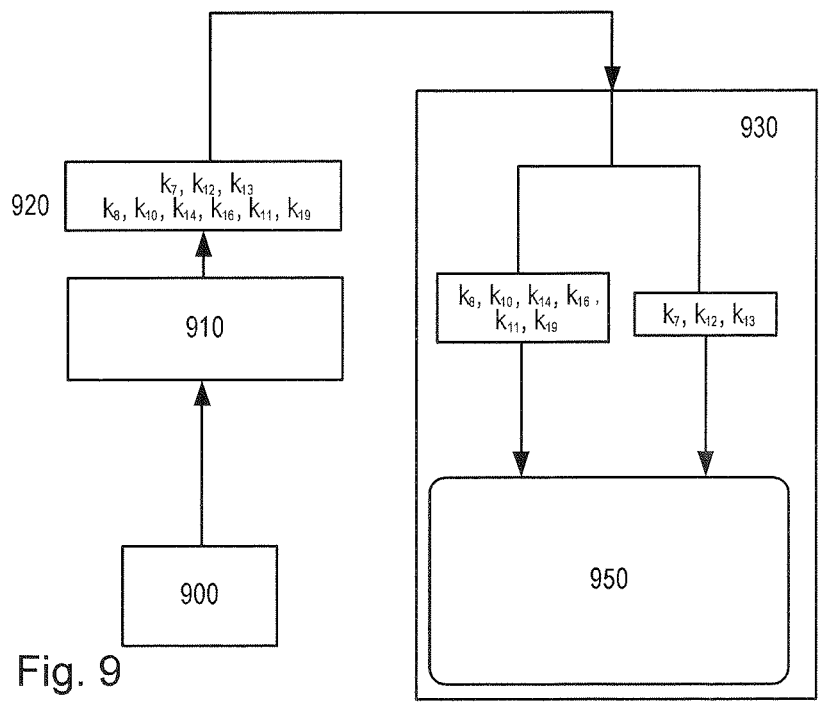
FIG. 9 shows a system architecture for a lithographic apparatus.

FIG. 9 illustrates this issue. A metrology tool 900 takes measurements from a wafer that has been previously exposed. This information is passed to a scanner stability module 910 (such as Baseliner or Gridmapper Intrafield manufactured by ASML in The Netherlands). Here the measurements are used to calculate particular predetermined, scanner specific parameters ($k_7, k_{12}$ etc), which are sent to the scanner 930 via scanner specific interface 920. This interface 920 only accepts the parameters if they are recognized as being comprised in the interface 920/scanner 930 parameterization. If different parameterization is detected, the interface 920 will simply reject them. If accepted, they will be used to perform corrections on the (necessarily scanner specific) models and hardware 950 of the scanner 930.

In particular, the current interface 940 is derived from the known GridMapper™ interface in which two 2-dimensional polynomials are used: one for the up-scanning fields, and another for the down-scanning fields). This GridMapper based parameterization suffers from the following two severe issues:

It does not cover all effects relevant for the scanner hardware:

the scanner stability module parameterization is unable to cover in detail the scanner intra-field effects: 3rd-order polynomials used in the scanner stability module for description of the intra-field are much more restrictive than the 1 mm-pitch GISM YTX,YTY,YRZ RS maps that are used in the scanner;

when used in conjunction with certain lithographic apparatus (such as Twinscan XT manufactured by ASML in The Netherlands), the scanner stability module parameterization has only limited capability for describing the wafer stage mirrors accurately: 5th-order polynomials are used in the scanner stability module, while 7th-order are required for properly tracking mirror drifts (as implemented in the 2DE scanner calibration);

when used in conjunction with other lithographic apparatus (such as Twinscan NXT manufactured by ASML in The Netherlands), the scanner stability module parameterization is unable to describe the drift of wafer stage encoders since the encoder drifts lead to non-polynomial distortion of the wafer grid (each of the NXT quadrants should be described by its own polynomial as the transitions between the quadrants may be not smooth).

Furthermore, the scanner stability module parameterization is not compact in that too many parameters are used for describing the scanner effects that it can cover, thus leading to sub-optimal noise suppression capability of the scanner stability module controller. For example, in the scanner stability module, scan-up/scan-down is effectively described by a full 2-dimensional polynomial (120 coefficients in total), while it is known that for the Twinscan XT system, the same effect can be described by simple 3rd-order 1-dimensional polynomials for the wafer stage mirrors (6 coefficients in total). In another example, the scanner stability module uses 120 coefficients for describing the wafer table thermal fingerprint (5th-order 2-dimensional polynomials are used for all the 6 intra-field parameters: tx,ty,rs,ra,ms,ma), while it is known that 4th-order polynomial grid based on only tx,ty per field is sufficient (approximately 30 coefficients).

It is therefore proposed to decouple the parameterization used for interfacing between the scanner/lithography device and scanner stability module/OTAS from the parameterization used in the scanner stability module controller. For example, with regard to the interface parameterization, this is best designed to be as generic as possible (having many degrees of freedom) to allow independent improvements in time for the scanner stability module controller and for the scanner hardware parameterization; The parameterization should also be made independent on the machine type, and therefore overdetermined to cover both current and near-future lithographic apparatus and envisioned scanner stability module controller parameterizations.

On the other hand, compact parameterization for the scanner stability module controller should be defined, with as few as possible degrees of freedom that compactly cover the scanner hardware, so as to maximize the noise-rejection capability of the scanner stability module controller. In this case, the scanner stability module controller parameterization is best made dependent on the lithographic apparatus and software release, e.g., control of WS mirror drift for XT is achieved using dedicated mirror model/parameterization, while control of NXT encoder drift is done using a different model/parameterization specific to NXT encoders. In one example, further discussion regarding this module controller parameterization is discussed in the co-pending application U.S. Publication No. 2011-0205510, published on Aug. 25, 2011, which is incorporated by reference herein in its entirety. The methods disclosed therein may be used in conjunction with the methods disclosed herein. With regard to the interface parameterization, the following specific example is proposed (for example only).

Blue Alignment Offsets—BAO's: per chuck.

BAO's compensate for the discrepancy between the actual positions of the exposed fields on the wafer and the expected positions (computed based on stage align, wafer align and TIS align data, where TIS is the Transmission Image Sensor). This compensation is computed in terms of 10-parameter linear model (x-translation tx, y-translation ty, symmetric wafer rotation rws, asymmetric wafer rotation rwa, symmetric wafer magnification mws, asymmetric wafer magnification mwa, symmetric field rotation rs, asymmetric field rotation ra, symmetric field magnification ms, asymmetric field magnification ma). Such a discrepancy can arise, for example, due the exposure-side vs. measure-side difference in the shape of the wafer chuck TIS plates, since the alignment model assumes that the TIS plates do not deform when the wafer chuck is moved from the measure side to the exposure side (the TIS plates carry both the TIS alignment marks used for measure-side alignment, TIS sensor gratings and the TIS sensor used for exposure-side TIS align). Another possible cause for the discrepancy is the mismatch between the designed relative offset between the TIS alignment marks and TIS sensor gratings/sensor.

Wafer Stage Measure-Side Grid Parameters:

A clamping grid map having high spatial frequency (say, 5 mm pitch) When the state of the measure-side grid (incl. clamping) is measured, enough data should be gathered, in terms of sampling density (e.g., 5 mm pitch), in order to be able to estimate how the customer alignment strategy would react to the changes in the measure grid.

Wafer stage exposure-side grid parameters: mirrors (per chuck per mirror): 1D-polynomials of high-order (say, 16-degree polynomials)—for use with Twinscan XT apparatus; encoders position (polynomial per encoder per chuck): 2D-polynomials of high-order (say, 8-degree polynomials)—for use with Twinscan NXT apparatus; 2DE thermal fingerprint (per chuck): 2D-polynomials of high-order (say, 8-degree polynomials); SUSD/SLSR (per chuck): 2D-polynomials of high-order (say, 8-degree polynomials). SUSD is the scan up/scan down effect: and is a measure of the shift of the fields exposed in the "up" scan direction with respect to the fields exposed in the "down" scan direction. It can be parameterized as the shift of the "up" and "down" fields from the "nominal" grid that corresponds to an average of both "up" and "down". SUSD can arise due to reproducible wafer slip with respect to wafer table, reproducible reticle slip with respect to the reticle clamp, non-elastic behavior of the wafer table/wafer chuck/reticle stage. SLSR is the step left/step right effect: It is a measure of the shift of the fields exposed after stepping from the "left" previous field with respect to the fields exposed after stepping from the "right" previous field; and can be parameterized as the shift of the "stepped from left" and "stepped from right" fields from the "nominal" grid that corresponds to an average of both "SL" and "SR". SLSR can arise due to reproducible wafer slip with respect to wafer table, non-elastic behavior of the wafer table/wafer chuck.

Intra-field parameters: reticle state encoder maps (YTX, YTY,YRZ): 1D-polynomials of high-order (say, 16-degree polynomials); average slit description (both dx and dy components): 1D-polynomial of high-order (say, 16-degree polynomial); Y-position dependency of the slit (both dx and dy components): a product of 1D-polynomial of high-order (say, 16-degree polynomial) in the slit and 1D-polynomial of high-order (say, 16-degree polynomial) in the scan direction.

It should be appreciated that any parameter described above in terms of a polynomial functions may equally be described in terms of a Fourier transform or any other suitable basis function that is able to describe the required degrees.

The above embodiment proposes to describe the wafer stage grid parameters via high-order (8-16) polynomials for mirrors, encoder positions, 2DE thermal fingerprint and SUSD/SLSR. Additionally, polynomial representation is suggested for the representation of intra-field parameters. However in a further embodiment, a much more efficient (and simpler) interface parameterization can be realized for the exposure grid of the scanner (both inter-field and intra-field).

Figure 10:
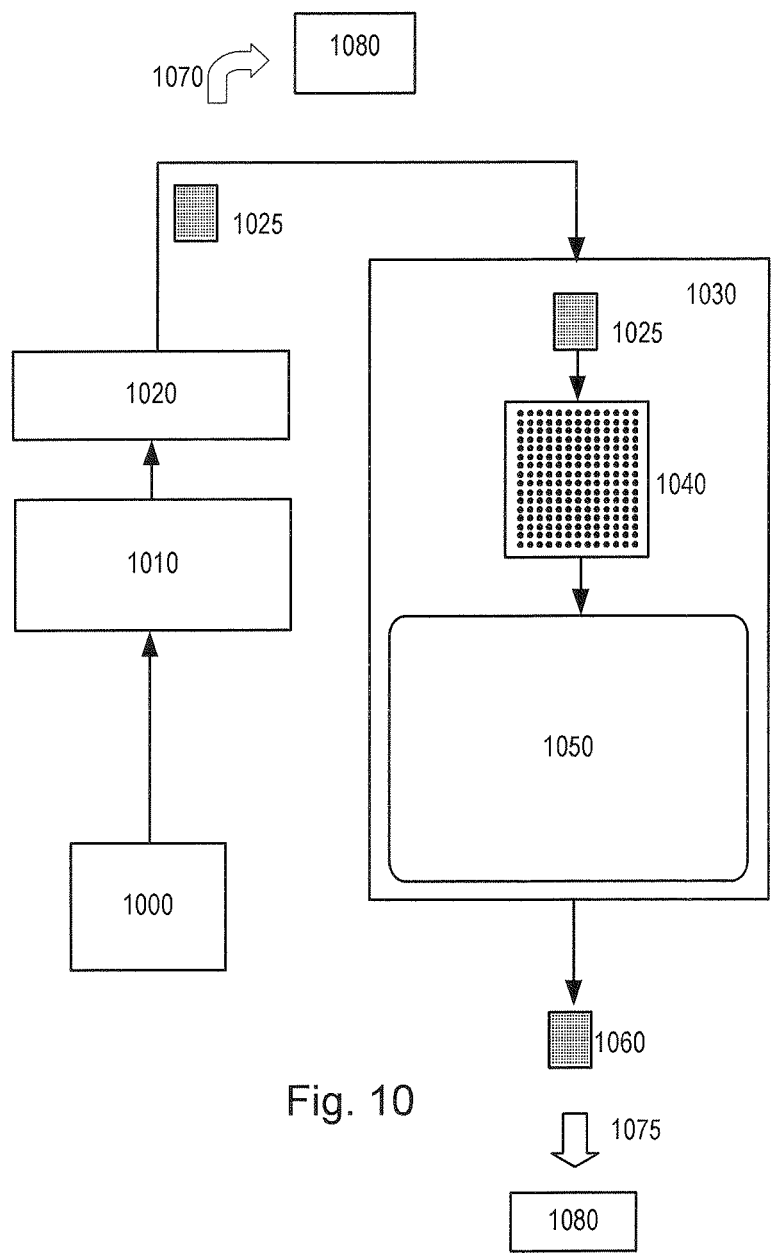
FIG. 10 shows a system architecture for a lithographic apparatus according to an embodiment of the present invention.

FIG. 10 illustrates this efficient parameterization concept. Again a metrology tool 1000 is used to take measurements from a wafer that has been previously exposed and this information is passed to a scanner stability module 1010 (such as Baseliner or Gridmapper Intrafield). However, in this embodiment the interface 1020 is parameterized by defining an intra-field reference grid 1025 (say, a Cartesian grid (having for example 13×N points, where N may be 19) that is dense enough to accurately represent all the distortions that the scanner 1030 can introduce, and using the raw (dx, dy) overlay defined in the nodes of the reference grid for the intra-field. Ideally the exposure grid may be parameterized also by letting the intra-field parameters vary from field to field in order to account for the possible variation of the intra-field fingerprint from field to field (e.g., due to wafer grid deformation).

This interface 1020 parameterization is therefore generic, not scanner specific, with the reference grid 1025 defining only the desired or requested corrections, regardless of whether the target scanner is capable of performing such corrections 1030. The scanner 1030 uses the reference grid 1020 by projecting it onto its internal scanner grid 1040 and performing the corrections on the (necessarily scanner specific) models and hardware 1050 of the scanner 1030. Of course, as the requested correction grid is generic, the scanner will not necessarily have the functionality to perform all requested corrections (in fact, this is unlikely). Instead the scanner 1030 uses the information in the reference grid to make the corrections it is capable of. The scanner will also output a further (e.g., 13×N) standardized reference grid 1060 comprising the actual scanner corrected raw data, that is the data that the scanner 1030 had the functionality to use, and therefore actually used, in performing corrections. This can be fed back for use by the controller 1010 to target the correction data of the requested reference grids 1025 to the scanner 1030 being used.

To enable simpler analysis of the correction data, side streams 1070, 1075 are derived where an application 1080 uses only specific chosen aspects/parameters of the requested and/or actual data defined on the reference grids 1025, 1060, to monitor trends over time.

In an embodiment the interface may be capable of the following: to specify (per field) vertical and horizontal dimensions of all the fields exposed on the wafer together with the field center coordinates; to specify (per field) exposure direction and exposure speed; and to specify (per field) the intra-field fingerprint on the reference grid (say, specify dx,dy overlay at fixed 13×19 points).

The reference grid can either be the same for all the fields, or different. In practice it is likely that a common grid will be used for all fields. When using exposure fields having different dimensions, the common reference grid can either be linked to the absolute positions on the largest possible field (the so-called full-field of 26 mm×32 mm for XT, NXT and EUV systems), or alternatively be allowed to scale with the field size via using a relative coordinate system on the field.

Although specific reference may be made in this text to the use of projection lithographic apparatus and scanning functionality, it should be appreciated that the concepts disclosed herein are equally applicable to imprint lithographic apparatus (whereby reference to "exposure" should be considered to be a reference to patterning by imprint lithography and any reference to projection specific apparatus should be considered a reference to the equivalent in imprint lithography as would be known to the skilled person) and/or stepper functionality (whereby any reference to "scanner", "scanning" or "scanner stability module" should be considered as a reference to the stepper equivalent as would be known to the skilled person.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus comprising:
   a support configured to support a patterning device;
   a substrate table configured to hold a substrate;
   a patterning system configured to transfer a pattern from the patterning device onto a target portion of the substrate;
   a control module configured to control at least one of the support, substrate table or patterning system by periodically retrieving measurements defining baseline control parameters from one or more reference substrates so as to determine parameter drift from the baseline control parameters, thereby enabling allowance and/or correction to be made for the drift, the reference substrates having initially undergone patterning so as to determine the baseline control parameters; and
   an interface between the control module and the lithographic apparatus;
   wherein a parameterization of the interface is generic and different from a control parameterization used for control of at least one of the support, substrate table or patterning system, and
   wherein the parameterization of the interface is projected onto the control parameterization before the correction is made.

2. The apparatus of claim 1, wherein the parameterization of the interface describes intra-field effects including one or more of reticle state encoder maps, average slit description in both dx and dy components and Y-position dependency of the slit.

3. The apparatus of claim 1, wherein the parameterization of the interface comprises defining an intra-field reference grid representing distortions introduced by the lithographic apparatus.

4. The apparatus of claim 3, wherein the intra-field parameters of the reference grid is capable of variation over different target portions in order to account for the possible variation of the intra-field fingerprint over different target portions.

5. The apparatus of claim 4, wherein the at least several degrees of freedom comprise 8 or 16.

6. The apparatus of claim 4, wherein all Intra-field parameters comprise 1D-polynomials or 1D Fourier transforms.

7. The apparatus of claim 3, wherein the parameterization of the interface specifies at least one of:
   vertical and horizontal dimensions of all the target portions patterned on the substrate together with the target portion center coordinates;
   exposure direction and exposure speed; and
   the intra-field parameters of the reference grid.

8. The apparatus of claim 7, wherein wafer stage patterning-side grid parameters comprise 1D polynomials, 2D polynomials, 1D Fourier transforms, or 2D Fourier transforms.

9. The apparatus of claim 3, wherein a common reference grid is used for all target portions, the common reference grid being linked to absolute positions on a relatively largest target portion for the lithographic apparatus.

10. The apparatus of claim 3, wherein a common reference grid is used for all target portions, the common reference grid being allowed to scale with a target portion size using a relative coordinate system on the target portion.

11. The apparatus of claim 1, wherein the parameterization of the interface is such that each parameter has at least several degrees of freedom.

12. The apparatus of claim 1, wherein the control parameterization comprises as few as possible degrees of freedom required for the lithographic apparatus.

13. The apparatus of any claim 1, further comprising:
   an illumination system configured to condition a radiation beam; and
   a projection system comprised in the patterning system,
   wherein the patterning device is capable of imparting the radiation beam with a pattern in its cross-section to form a patterned radiation beam and the projection system is configured to project the patterned radiation beam onto the target portion of the substrate to perform the patterning.

14. A method of using a control module to control scanning/stepping function of a lithographic apparatus comprising:
   exposing a reference substrate to determine baseline control parameters pertaining to the scanning/stepping function;
   periodically retrieving the baseline control parameters from the reference substrate;
   determining parameter drift from the baseline control parameters; and
   compensating based on the determination,
   wherein the method is performed using a parameterization for control different than a generic parameterization for communication between the control module and the lithographic apparatus, and
   wherein the parameterization for the communication is projected onto the parameterization for the control before the compensating is made.

15. The method of claim 14, wherein the parameterization used for communication between the control module and the lithographic apparatus is operable to describe intra-field effects including one or more of reticle state encoder maps, average slit description in both dx and dy components and Y-position dependency of the slit.

16. The method of claim 14, wherein the parameterization used for communication between the control module and the lithographic apparatus comprises an intra-field reference grid representing distortions introduced by the lithographic apparatus.

17. The method of claim 16, wherein the intra-field parameters of the reference grid is capable of variation over different target portions in order to account for the possible variation of the intra-field fingerprint over different target portions.

18. The method of claim 16, wherein the parameterization used for communication between the control module and the lithographic apparatus specifies at least one of:
vertical and horizontal dimensions of all target portions patterned on the substrate together with target portion center coordinates;
exposure direction and exposure speed; and
the intra-field reference grid.

19. The method of claim 16, wherein a common reference grid is used for all target portions, the common reference grid being linked to the absolute positions on the largest possible target portion for the lithographic apparatus.

20. The method of claim 16, wherein a common reference grid is used for all target portions, the common reference grid being allowed to scale with the target portion size using a relative coordinate system on the target portion.

21. The method of claim 14, wherein the parameterization used for communication between the control module and the lithographic comprises at least several degrees of freedom.

22. The method of claim 21, wherein the at least several degrees of freedom comprise 8 or 16.

23. The method of claim 22, wherein wafer stage patterning-side grid parameters comprise 1D polynomials, 2D polynomials, 1D Fourier transforms, or 2D Fourier transforms.

24. The method of claim 21, wherein all Intra-field parameters comprise 1D-polynomials or 1D Fourier transforms.

25. The method of claim 14, wherein the control parameterization comprises as few as possible degrees of freedom required for the lithographic apparatus.

26. The method of claim 14, wherein the control parameterization is specific for the lithographic apparatus and software used.

27. The method of claim 14, wherein the lithographic apparatus operates in at least a scanning mode wherein a patterned radiation beam is scanned across a target portion of a substrate.

* * * * *

UNITED STATES PATENT AND TRADEMARK OFFICE
CERTIFICATE OF CORRECTION

PATENT NO. : 8,947,630 B2
APPLICATION NO. : 13/013333
DATED : February 3, 2015
INVENTOR(S) : Padiy et al.

Page 1 of 1

It is certified that error appears in the above-identified patent and that said Letters Patent is hereby corrected as shown below:

In the claims,

In column 17, line 42, claim 1, please delete "allowance and/or".

Signed and Sealed this
Twelfth Day of January, 2016

Michelle K. Lee
*Director of the United States Patent and Trademark Office*